United States Patent [19]
Wilson

[11] 3,943,556
[45] Mar. 9, 1976

[54] METHOD OF MAKING A HIGH FREQUENCY SEMICONDUCTOR PACKAGE

[75] Inventor: Richard W. Wilson, Phoenix, Ariz.

[73] Assignee: Motorola, Inc., Chicago, Ill.

[22] Filed: Feb. 10, 1975

[21] Appl. No.: 548,327

Related U.S. Application Data

[63] Continuation of Ser. No. 383,872, July 30, 1973, abandoned.

[52] U.S. Cl. .................. 357/74; 357/68; 357/69; 357/71; 357/81; 333/84 M
[51] Int. Cl.² .................. H01L 23/02; H01L 23/12
[58] Field of Search ............ 357/68, 69, 71, 74, 81; 333/84 M

[56] References Cited
UNITED STATES PATENTS

| | | | |
|---|---|---|---|
| 3,626,259 | 12/1971 | Garboushian | 357/74 |
| 3,641,398 | 2/1972 | Fitzgerald | 357/74 |
| 3,681,513 | 8/1972 | Hargis | 357/74 |
| 3,713,006 | 1/1973 | Litty et al. | 357/74 |
| 3,753,056 | 8/1973 | Cooke | 357/71 |
| 3,769,560 | 10/1973 | Miyake | 357/81 |
| 3,784,883 | 1/1974 | Duncan et al. | 357/74 |
| 3,784,884 | 1/1974 | Zoroglu | 357/74 |
| 3,786,375 | 1/1974 | Sato et al. | 357/74 |

*Primary Examiner*—Andrew J. James
*Attorney, Agent, or Firm*—Harry M. Weiss; Charles R. Hoffman

[57] ABSTRACT

A method for manufacturing a low cost high frequency transistor package including a metal header, a metallized apertured ceramic insulator affixed to the header, a metallized beryllia insulator, and two cylindrical bonding rails within the aperture of the ceramic insulator attached to the header. The two bonding rails may be segments of wire. Metal leads are attached to the ceramic insulator. A very low inductance path through the bonding rails to the header results. The method includes positioning a first solder preform on the header, positioning the metallized, apertured ceramic insulator on the first preform, positioning the metallized beryllia insulator and the plated wire segments which form the bonding rails within the aperture of the first preform, positioning second and third preforms on the apertured ceramic insulator metallization, positioning the leads on said second and third preforms, and heating the package in a suitable atmosphere to a temperature above the melting point of the preforms to fuse the parts into a unit.

4 Claims, 4 Drawing Figures

METHOD OF MAKING A HIGH FREQUENCY SEMICONDUCTOR PACKAGE

This is a continuation of application Ser. No. 383,872 filed July 30, 1973, now abandoned.

BACKGROUND OF THE INVENTION

Field of the Invention

This invention relates to methods of manufacturing low cost, high frequency semiconductor packages having very low parasitic inductance to the header.

2. Description of the Prior Art:

High frequency semiconductor packages are used for holding high frequency semiconductor components, such as microwave transistors and the like, and for providing readily available terminals for connection to other components. For such packages it is important to reduce parasitic coupling between terminals, which parasitic coupling degrades performance.

A variety of high frequency semiconductor packages utilized in the past have suffered from a variety of shortcomings including the necessity of providing wire bonding connections from the semiconductor component to lead terminals at different heights, being formed of a large number of conductive and insulative members bonded together, requiring expensive precision components such as apertured beryllia insulators, and requiring expensive apparatus for the manufacture of the packages. A high frequency semiconductor package having a structure which provides excellent high frequency performance and yet requires a small number of parts in the construction thereof is described in pending U.S. patent application, Ser. No. 303,466 now U.S. Pat. No. 3,784,884 assigned to the assignee of the present invention. The structure described herein requires coined bonding rails extending from the header in one embodiment thereof, requiring expensive coining apparatus and also requiring the use of an expensive material such as silver for the header. Further, design modifications for the prior art high frequency semiconductor packages to accommodate larger semiconductor chips, usually require extensive redesign of most of the package parts and fabrication apparatus, thereby making design modifications expensive.

The present invention solves many of the above-mentioned shortcomings of the prior art by providing a very low cost method of manufacturing a high frequency semiconductor package wherein low cost parts are assembled utilizing inexpensive apparatus, and wherein design changes affect a reduced number of the parts of the package.

SUMMARY OF THE INVENTION

It is an object of this invention to provide a low cost high frequency semiconductor package having improved construction and reduced manufacturing costs.

Another object of this invention is to provide an improved low cost method of manufacturing such a semiconductor package.

Another object of this invention is to provide a method for providing a low cost bonding rail in a high frequency semiconductor package by fusing a segment of wire or the like to a low cost metal header simultaneously with the attaching of ceramic insulators thereto.

Other objects will be clear upon reading the following description and referring to the Drawings.

Briefly described, the invention provides a semiconductor package including a metal header, first and second metallized insulators on the surface of the header, and an essentially cylindrical bonding rail between the first and second insulators all attached to the surface of the metal header. First and second leads are attached to the first insulator, so that wire bonds may be provided from a semiconductor chip attached to the second insulator to the bonding rail and to the first and second leads. The process for making the semiconductor package includes the steps of positioning a first preform on the surface of the metal header, positioning the first and second insulating means and also the bonding rail on the first preform, and heating the assembly to a temperature higher than the melting point of the first preform to attach the first and second insulator and bonding rail to the metal header. Second and third preforms may be positioned on the first insulator, and leads positioned thereon prior to said heating cycle.

DESCRIPTION OF THE DRAWINGS

FIG. 5 is a cross-sectional view of yet another embodiment of the invention.

DESCRIPTION OF THE INVENTION

Figure 1:
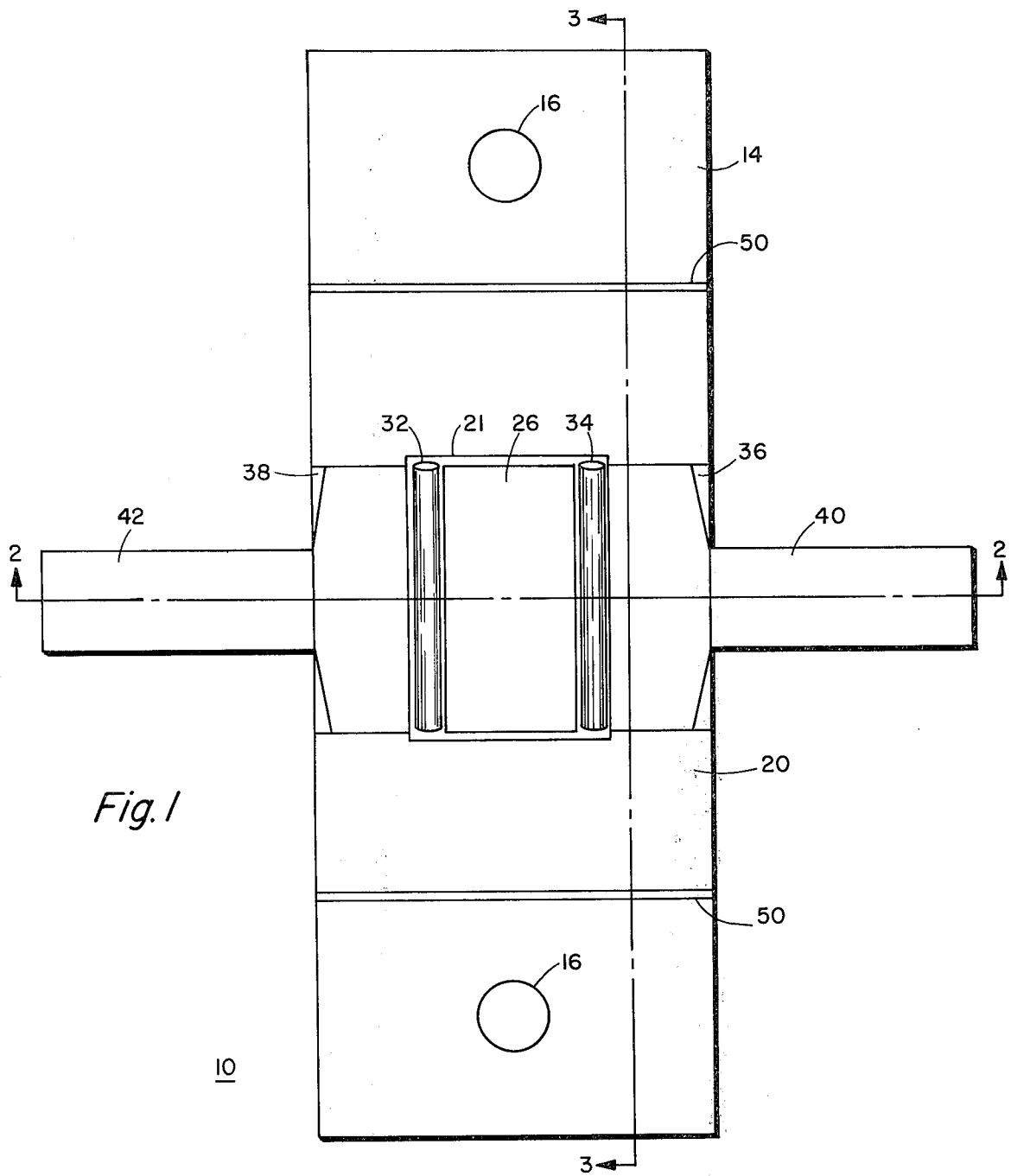
FIG. 1 is a plan view of a preferred embodiment of the invention.

In the drawings, a high frequency package is shown on a large scale for convenient illustration. It will be understood that for many uses it will be quite small, with package dimensions of a few tenths of an inch or so. The terms "top", "bottom", etc. will be used for convenience in the description hereafter, and refer to the orientation as shown in the drawings. It will be understood that in use the package may have any desired orientation.

Figure 2:
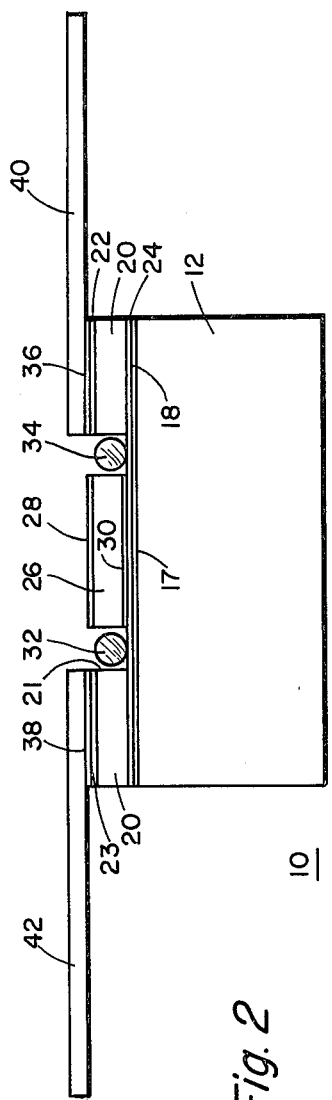
FIG. 2 is a cross-sectional view taken substantially in the direction of arrows 2—2 of FIG. 1.
Figure 3:
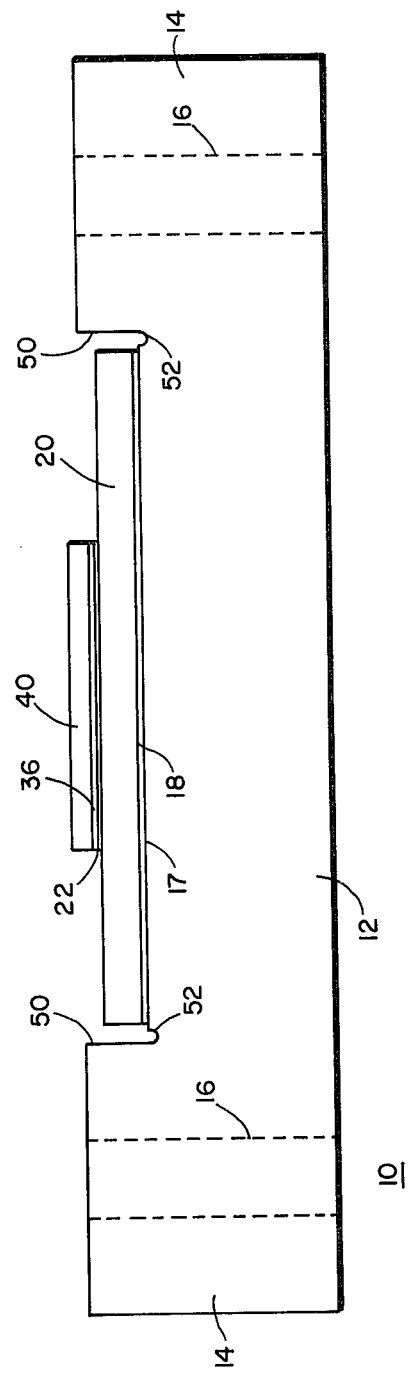
FIG. 3 is another cross-sectional view taken substantially in the direction of arrows 3—3 of FIG. 1.

Referring to FIGS. 1 – 3, which are diagrams of several views of a preferred embodiment of the invention, it is seen that the semiconductor package 10 includes a metal header 12, which may be copper. Referring to FIG. 2, a first insulator 20, which may be ceramic, preferably alumina ($Al_2O_3$), is attached to upper surface 17 of copper header 12. Alumina insulator 20 has an opening 21 therein which preferably is rectangular. Insulator 20 is attached to surface 17 by means of metallization layers 18 and 24, discussed hereinafter. A second insulator 26 is attached to surface 17 of copper header 12, and may be ceramic, preferably beryllia (BeO). First and second bonding rails 32 and 34 are positioned between beryllia insulator 26 and alumina insulator 20, preferably within rectangular aperture 21. Bonding rails 32 and 34 are essentially cylindrical, and are preferably links of copper wire cut to a suitable length. The diameter of cylindrical bonding rails 32 and 34 is advantageously chosen to be approximately the same as the thickness of insulator 26. First and second leads 40 and 42 are attached to insulator 20, preferably on opposite sides of opening 21, by means of metallization layers 22, 23, 36, and 38, described hereinafter.

Referring particularly to FIG. 1, and to FIG. 3, it is seen that header 12 may have flanges 14 which extend above surface 17 and outward from insulator 20 in a direction perpendicular to the axis of leads 40 and 42. Flanges 14 may have holes 16 therein to facilitate mounting of the semiconductor package 10. The copper header 12 has a notch 50 therein, surface 17 forming the bottom of notch 50. Grooves 52 at the bottom edges of notch 50 are optionally provided for reasons discussed hereinafter.

The upper surface of beryllia insulator 26 is metallized with metallization layer 28, and the bottom surface is metallized with metallization layer 30, which, along with metallization layer 18 provides means for attaching of insulator 26 to header 12.

A high frequency semiconductor device, such as a microwave transistor, may then be die bonded to metallization layer 28, and the transistor's base terminal bonding pads may be symmetrically bonded to bonding rails 32 and 34 to provide extremely low inductance in series with the base lead. The emitter and collector bonding pads may, respectively, be stitch bonded to leads 40 and 42 to provide an extremely high frequency device with superior operating characteristics suitable for use in numerous applications. It should be noted that the semiconductor package 10 is especially suitable for use in stripline applications.

Figure 4:
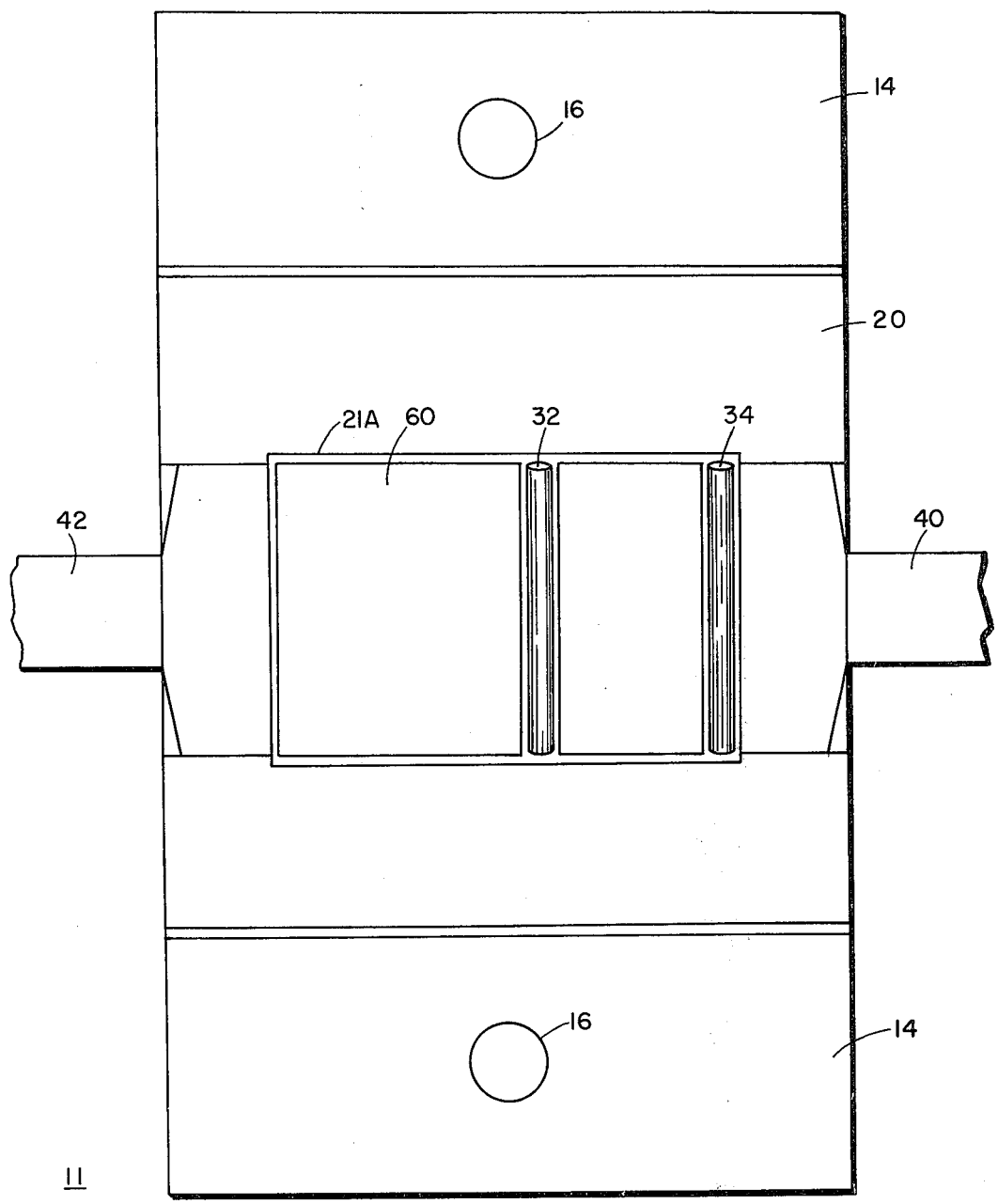
FIG. 4 is a plan view of another embodiment of the invention.

A plan view of another embodiment is shown in FIG. 4, wherein semiconductor package 11 differs from semiconductor package 10 of FIGS. 1 – 3 in that the opening 21A which is preferably rectangular, in insulator 20 is larger than opening 21 in FIG. 1. Cylindrical bonding rails 32 and 34 and beryllia insulator 26 are positioned similarly in FIG. 1 and in FIG. 4, but additional room is still available in opening 21A, wherein additional components, such as capacitors or the like may be affixed. A spacer 60 is shown within opening 21A in FIG. 4, and may be used to aid the assembly of semiconductor package 11, as described hereinafter, and then subsequently removed, or it may be utilized as a substrate on which to mount other components. In other respects, semiconductor packages 10 and 11 are similar.

The method of manufacturing the semiconductor package according to the present invention is described referring to FIGS. 1 – 3. The metal header 12, which is preferably copper, as previously described, may have notch 50 formed therein by suitable known methods, such as machining. A first solder preform 18, which may be a silver-copper eutectic material, is positioned on surface 17. Insulator 20, which advantageously is alumina having lower metallized surface 24 and metallized regions 22 and 23 on the upper surface thereof, is positioned on preform 18. Metallized regions 22, 23, and 24 may be any suitable type of metallization, such as titanium and nickel, which may be suitably fused with preform 18. A second insulator 26, which may be beryllia having metallized surfaces 28 and 30 is positioned on preform 24, within opening 21 in alumina insulator 20. Metallization layers 28 and 30 may be any suitable type which may be successfully fused with preform 18 and to which a semiconductor die may be successfully die bonded to the completed package. Metallization layers 28 and 30 advantageously are titanium-tungsten-gold, (or, alternatively, titanium-molybdenum-gold) the titanium forming a layer adherent to the beryllia, the tungsten (or molybdenum) acting as a barrier to prevent migration of the titanium, and the gold forming a layer to which further gold plating or die bonding can be achieved.

A first bonding rail 32, which advantageously is a cylindrical segment of copper wire plated with nickel and gold, is positioned on preform 18 between beryllia insulator 26 and alumina insulator 20, and a second similar bonding rail 34 is positioned on the opposite side of beryllia insulator 26 between it and alumina insulator 20. Semiconductor package 10 may then be heated to a temperature higher than the melting point of preform 18 to fuse or braze the above-recited parts into a single unit. It will be noted that the terms "fuse" and "braze" are used interchangeably herein to describe the fusing which results when preform 18 melts.

Leads 40 and 42, which are preferably made of Kovar, may be attached to the unit either before or after the previously described heating operation. In either case, preforms 36 and 38 are positioned, respectively, on metallized regions 22 and 23 of alumina insulator 20, and lead members 40 and 42 are then positioned on preforms 36 and 38, respectively. Preforms 36 and 38 may be of the same material as preform 18. Preferably, lead members 40 and 42 are aligned prior to the aforementioned heating step, so that brazing together of all parts of the entire unit occurs simultaneously during a single heating cycle.

Lead members 40 and 42 may be attached to a single lead frame member (not shown), or they may be separate members.

To produce the semiconductor package 11 depicted in FIG. 4, the above-recited method is modified to the extent that spacer 60, which may be a piece of unmetallized ceramic of suitable dimensions, is positioned in one side of opening 211 prior to positioning bonding rails 32 and 34. The spacer 60 remains in place until after the heating step, and may then be removed and reused.

The heating step may be performed in a suitable atmosphere, such as hydrogen, to avoid oxidation of the various metal surfaces. In order to avoid the "skin effect" at very high frequencies, the entire unit 10 (or 11) may be gold plated, the gold adhering only to the exposed metal surfaces.

It should be noted, referring to FIG. 3, that grooves 52 may be provided in copper header 12 prior to positioning preform 18 in order to eliminate rounded corners in the bottom of groove 50 upon which preform 18 and/or an edge of alumina insulator 20 could sit, thereby raising it and preventing proper contact to surface 17.

It should be further noted that during the above-described manufacturing procedure the copper header may be positioned in an assembly fixture, in a groove or slot thereof, to provide registration in one direction, and the registration in another direction may be accomplished by means of groove 50. Easy registration of the beryllia insulator 26 and the cylindrical bonding rails 32 and 34 are achieved by virtue of the opening 21 and the tolerances thereto. Positioning of lead members 40 and 42 may be accomplished by means of guide pins in said assembly fixture (not shown) and a holding weight (not shown) may be provided to press beryllia insulator 26 and lead members 40 and 42 against the unit during the fusing operation.

It should be appreciated that bonding rails 32 and 34 are preferably essentially cylindrical to facilitate easy positioning thereof by merely dropping them into the space between beryllia insulator 26 and alumina insulator 20, since the diameter of the cylindrical copper segments may be in the range of 10 – 12 mils. The tolerances between alumina insulator 20, bonding rails 32 and 34, and beryllia insulator 26 are advantageously as small as possible to reduce size and yet facilitate easy positioning thereof. The cylindrical copper segments could be coined slightly after the package 10 is fabricated if necessary to facilitate improved wire bonding thereto. Also, it should be appreciated that the wire could be pressed slightly out of round to increase the height in one direction or to facilitate a fit into narrow spacings between insulators 26 and 20.

Those skilled in the art will recognize that additional leads could be attached to alumina insulator 20, utilizing process steps entirely similar to those described, to provide connection to a semiconductor chip having more than three electrodes, for example a high frequency field effect transistor tetrode.

It should be appreciated that other preform compositions than those described, having melting temperatures less than 780°C–800°C, may be advantageously utilized.

Those skilled in the art will recognize that after die bonding and wire bonding of a semiconductor chip to the beryllia insulator and the bonding rails, a suitable lid with an appropriate cavity therein may be epoxied or otherwise affixed in place on top of the high frequency transistor package structure to protect the wire bonds from accidental damage.

In summary, the invention provides a simplified method of producing a high performance, high frequency semiconductor package at much lower costs than previously achievable. Improved performance is achieved by virtue of the simplified structure over that of the prior art, and the reduced cost is achieved by provision of a workable, produceable fabrication method which permits the use of low cost materials (especially for the copper header), and the use of a single heating step to fuse together a relatively small number of individual parts to obtain the completed package. The method presented is further advantageous in that it is easily automated compared to fabrication methods for the more complex high frequency packages of the prior art. Further, no large coining presses or expensive forming die are required to produce the bonding rails on the header. Changes in the dimensions of the available die bonding area may be achieved by very low cost design changes in which only the dimensions of the beryllia insulator and the aperture in the alumina insulator are altered. In comparable prior art high frequency packages the bonding rails were coined from the header, causing the requirement of providing expensive new forming die for each design change. Therefore, it is seen that the invention provides a lower cost high frequency semiconductor package compared to those previously obtainable.

Although the invention has been described with reference to several embodiments thereof, it will be clear to those skilled in the art that variations in arrangement of parts and manufacturing steps may be made within the scope of the invention to suit varying requirements.

What is claimed is:

1. A semiconductor package comprising:
    a metal header having a surface;
    a metallization layer on said surface including titanium and nickel fused with solder;
    a first apertured alumina insulator on said surface exposing said metallization on said surface;
    a second non-apertured beryllia insulator on said surface within said aperture; and
    a segment of copper wire plated with nickel and gold positioned in said aperture between said first insulator and said second insulator attached to said metal header by said metallization layer forming a bonding rail.

2. The semiconductor package as recited in claim 1 further including a second segment of copper wire plated with nickel and gold positioned in said aperture between said first insulator and said second insulator attached to said metal header by said metallization layer forming a second bonding rail on an opposite side of said second insulator from said first segment.

3. The semiconductor package as recited in claim 1 wherein said second insulator is coated on its major surfaces with titanium-tungsten-gold metallization.

4. The semiconductor package as recited in claim 1 wherein said second insulator is coated on its major surfaces with titanium-molybdenum-gold metallization.

* * * * *